(12) United States Patent
LeBoeuf et al.

(10) Patent No.: US 8,536,935 B1
(45) Date of Patent: Sep. 17, 2013

(54) UNIFORM POWER REGULATION FOR INTEGRATED CIRCUITS

(75) Inventors: Thomas P. LeBoeuf, Albuquerque, NM (US); Eric E. Edwards, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 354 days.

(21) Appl. No.: 12/910,719

(22) Filed: Oct. 22, 2010

(51) Int. Cl.
*G05F 1/575* (2006.01)
*H02M 3/00* (2006.01)
*G06F 1/26* (2006.01)

(52) U.S. Cl.
USPC ........... 327/541; 327/543; 323/267; 323/280; 323/313

(58) Field of Classification Search
None
See application file for complete search history.

(56) References Cited

U.S. PATENT DOCUMENTS

| | | | |
|---|---|---|---|
| 5,671,149 A | 9/1997 | Brown | |
| 5,914,873 A | 6/1999 | Blish, II | |
| 5,917,311 A * | 6/1999 | Brokaw | 323/280 |
| 6,307,802 B1 * | 10/2001 | Manning | 365/226 |
| 6,853,322 B2 * | 2/2005 | Dedic | 341/144 |
| 6,928,560 B1 | 8/2005 | Fell, III et al. | |
| 6,936,917 B2 | 8/2005 | Lopata et al. | |
| 7,096,304 B2 * | 8/2006 | Ho et al. | 710/306 |
| 7,221,212 B2 * | 5/2007 | Crippa et al. | 327/540 |
| 7,265,605 B1 | 9/2007 | Vasudevan | |
| 7,400,123 B1 | 7/2008 | Voogel | |
| 7,589,584 B1 * | 9/2009 | Bui | 327/538 |
| 7,733,075 B1 | 6/2010 | Vasudevan | |
| 2007/0296384 A1 | 12/2007 | Dow et al. | |
| 2009/0079406 A1 * | 3/2009 | Deng et al. | 323/280 |
| 2009/0115384 A1 * | 5/2009 | Venes et al. | 323/280 |

* cited by examiner

*Primary Examiner* — Lincoln Donovan
*Assistant Examiner* — Terry L Englund
(74) *Attorney, Agent, or Firm* — LeRoy D. Maunu

(57) ABSTRACT

A system for uniform power regulation of an integrated circuit is disclosed. In each of a plurality of regions, the system includes a comparison circuit having a first input coupled to receive a reference voltage and a second input coupled to receive a feedback voltage. The comparison circuit provides a gating voltage to a driver circuit that is coupled to a first supply voltage. The driver circuit is configured to provide a regulated voltage responsive to the gating voltage. A feedback adjustment circuit is configured to trim the regulated voltage by a region-specific trim value and output the trimmed regulated voltage as the feedback voltage on the output.

18 Claims, 5 Drawing Sheets

UNIFORM POWER REGULATION FOR INTEGRATED CIRCUITS

FIELD OF THE INVENTION

An embodiment of the present invention generally relates to power regulation of integrated circuits.

BACKGROUND

In a typical integrated circuit, the power supply voltage may exhibit transient variations that adversely affect performance of the IC. Voltage drivers are often used to produce a slightly lower regulated voltage (e.g. Vgg) from a higher supply voltage (e.g. VccAux). A typical IC may include many voltage drivers distributed in different regions of the IC for power regulation. Due to variations in impedance, transmission lines of varying lengths, and variation in transistor performance across an integrated circuit (IC), it can be difficult to provide a regulated voltage that is uniform across the IC.

In some previous systems, the driver circuits were controlled by a single regulation circuit. The regulation circuit compared the regulated output voltage, Vgg, to a reference voltage, Vgg_ref, to produce a gating voltage that indicates any difference between Vgg and Vgg_ref. For example, if Vgg dropped below the expected Vgg_ref, the gating voltage from the regulation circuit would increase. When the gating voltage increased above a threshold, it caused the driver circuits to pass current from VccAux to the Vgg output. The current passing to the Vgg output causes the regulated Vgg output voltage to increase and the gating voltage to decrease.

However, this method does not provide stable regulation in larger area ICs. Due to variations in impedance and resistance across the IC and distribution over transmission lines of varying lengths, the gating voltage was not consistent across the IC. As a result, the regulated Vgg output from the voltage drivers may vary geographically as the area of the IC is increased.

To mitigate these affects, some systems include intermediate unity buffers between the regulation and driver circuits to distribute the gating voltage over a wider area. When implemented in an IC with larger areas, intermediate unity analog buffers are included between the regulation and driver circuits to drive signals to their destination driver circuits. However, the unity buffers introduce additional error due to variation of transistors in different buffer circuits. These variations reduce system stability of the IC.

The value of the phase margin is another characteristic of voltage supply circuits that is affected by process variations. Voltage supply circuits, which regulate Vgg using a feedback loop comparison, are subject to oscillations under certain conditions. In adverse conditions (e.g., in high temperatures, or in an integrated circuit manufactured at the fast process corner) such a loop can begin to oscillate. If the phase margin of the circuit is sufficiently large, the oscillation will abate. If the phase margin of the circuit is too small, the response time of one or more driver circuits may be too great, resulting in an overcorrection. As the circuit repeatedly overcorrects for the error, the Vgg voltage will oscillate up and down and the integrated circuit will not function properly.

One or more embodiments of the present invention may address one or more of the above issues.

SUMMARY

In one or more embodiments, a system is provided for uniform power regulation of an integrated circuit. In each region of a plurality of regions of the integrated circuit, the system includes a comparison circuit, at least one driver circuit, and a feedback adjustment circuit. The comparison circuit has a first input coupled to receive a reference voltage and a second input coupled to receive a feedback voltage. The comparison circuit is configured to provide a gating voltage to the driver circuit. Each driver circuit is coupled to a first supply voltage and is configured to provide a regulated voltage responsive to the gating voltage. The feedback adjustment circuit has an input coupled to at least one regulated voltage from the at least one driver and an output coupled to the second input of the comparison circuit. The feedback adjustment circuit is configured to trim the regulated voltage by a region-specific trim value and output the trimmed regulated voltage as the feedback voltage on the output.

In another embodiment, a programmable IC is provided. The programmable IC includes a plurality of programmable resources, a persistent memory, and a power regulation circuit coupled to the programmable resources and to the persistent memory. The power regulation circuit is configured to provide a reference voltage to comparison circuits in each one of a plurality of regions of the IC. In each of the plurality of regions, a gating voltage is generated. The gating voltage represents the difference between the reference signal and a feedback signal. Each region includes one or more driver circuits configured to couple a power supply voltage to a regulated output voltage when enabled by the gating voltage. The IC generates a feedback voltage in each region by trimming the regulated output voltage by a region-specific trim value stored in the persistent memory.

In yet another embodiment, a power regulation circuit for an IC is provided. The power regulation circuit includes a reference voltage generator circuit, and at least two power regulation modules located in regions of the IC. Each power regulation module includes a difference amplifier, one or more voltage drivers, and an adjustable voltage bridge. The difference amplifier has a first input coupled to an output of the reference voltage generator circuit. Each of the one or more voltage drivers has an input coupled to an output of the difference amplifier of the module. The voltage drivers each have an output coupled to provide a regulated voltage to a power net of the region. An adjustable voltage bridge is coupled between the power net and a ground voltage. The output of the adjustable voltage bridge is coupled to a second input of the difference amplifier.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings in which.

DETAILED DESCRIPTION

Due to variations in impedance, lengths of transmission lines, and transistor performance across an integrated circuit (IC), it can be difficult to provide a regulated voltage that is uniform across the IC. In one or more embodiments, a system for uniform power regulation across an IC is provided. The system independently regulates power in each of a plurality of regions of the IC based on the output voltage in the respective regions.

Because each region is regulated independently, a gain of the regulation circuit can be increased or decreased on a region-by-region basis to compensate for regional performance variations. Whether determined during wafer sort or using self-test circuitry, once the region-specific power regulation settings are determined, the settings may be stored in a persistent memory of the IC and used thereafter to achieve uniform power regulation.

Figure 1:
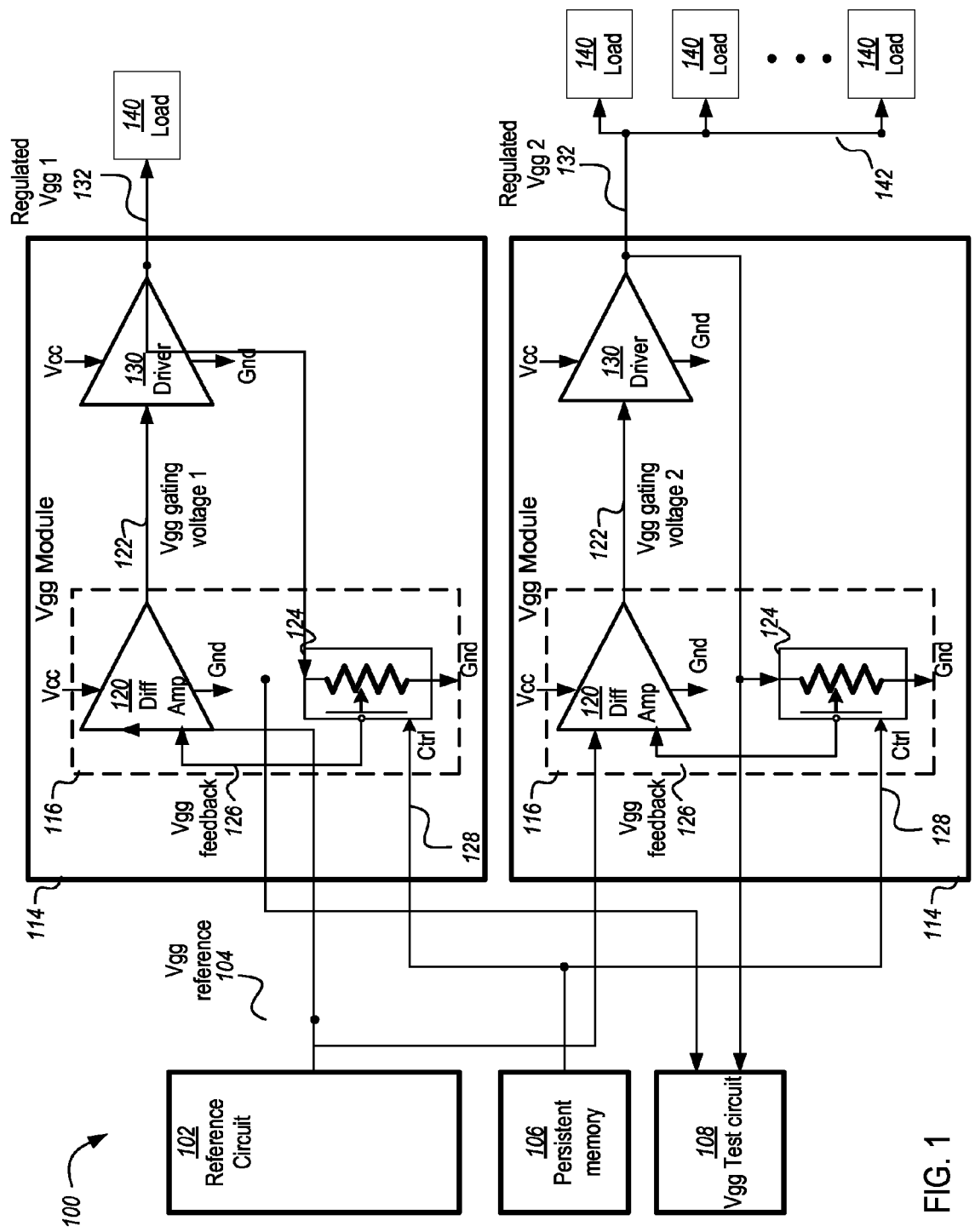
FIG. 1 shows an example circuit for uniform power regulation across plurality of regions of an integrated circuit (IC)

FIG. 1 shows an example circuit for uniform power regulation across a plurality of regions of an integrated circuit. The circuit 100 for uniform power regulation includes a reference circuit 102 configured to generate a Vgg reference voltage 104. A plurality of Vgg modules 114 located in different geographic locations of the IC is coupled to receive the Vgg reference voltage 104. Each Vgg module 114 has its own independent feedback control system and creates its own regulated Vgg output voltage 132 to power a respective load 140. Each module has a regulation circuit 116 to generate a Vgg gating voltage 122, which controls one or more driver circuits 130 in the region. The one or more driver circuits 130 may distribute a regulated voltage over a respective power distribution network (142) of the region or directly to individual current loads 140.

The same Vgg reference voltage 104 is transmitted to each Vgg module 114. Each Vgg module 114 uses this voltage as the basic reference for comparison with the feedback provided by the regulated Vgg output voltage 132. Each Vgg module 114 includes a regulation circuit 116, which determines a difference between the Vgg reference voltage 104 and Vgg feedback voltage 126. The difference output from the regulation circuit 116 is the Vgg gating voltage 122, which is used to control driver circuits 130 of the Vgg module 114. If the Vgg feedback 126 (derived from the regulated Vgg output 132) drops below the Vgg reference voltage 104, the output Vgg gating voltage 122 increases. The output voltage of each driver circuit 130 is controlled by the voltage of the Vgg gating voltage 122. For example, in one driver implementation, when the Vgg gating voltage 122 is increased above a threshold, the circuitry of driver 130 passes current from the VccAux source to the regulated Vgg output voltage 132. The current passing to the Vgg output causes the regulated Vgg output voltage 132 to increase. This increased voltage propagates through the regulated Vgg feedback path (132 to 126) via trim circuit 124. In this manner, the regulation circuit 116 adjusts the Vgg gating voltage 122 to control the regulated Vgg output 132 as appropriate.

Since each Vgg module 114 is susceptible to variations in transistor performance due to fabrication processes, a trim circuit 124 is included to adjust the gain of the Vgg module 114. The gain is set in each region to cause the driver circuits 130 of the different Vgg modules 114 to output the same regulated Vgg output voltage. One skilled in the art will recognize that the gain of the Vgg module may also be adjusted using a number of alternative trim circuits 124. In one implementation, the trim circuit 124 adjusts the gain by adjusting the resistance of one or more signal paths of the Vgg module. For example, a resistance may be adjusted on the path of Vgg reference voltage 104, on the feedback path of regulated Vgg (132 to 126), or on both paths. For ease of illustration, the embodiments and examples described herein will primarily perform gain adjustment by adjusting a resistance on the regulated Vgg feedback path 132 to 126.

The trim circuit 124 acts as a feedback adjustment circuit for adjusting the regulated Vgg voltage 132 for providing the Vgg feedback voltage 126. In each Vgg module 114, the trim circuit 124 trims the feedback signal by a region-specific trim value. The region-specific trim value is determined by testing the regulated Vgg output voltage 132 of each Vgg module 114 to determine the amount of variation between the Vgg modules 114. The region-specific trim values are selected to cause all of the regulated Vgg output voltages 132 to be equal. Those skilled in the art will recognize that the regulated Vgg output voltages may not be exactly equal but may be substantially equal consistent with a desired level of tolerance for particular implementation. Once determined, the region-specific trim value is stored in a persistent memory 106 of the IC. In this example, a single persistent memory is used to store all the region-specific trim values. One skilled in the art will recognize that the region-specific trim values may also be stored separately in a persistent memory dedicated to each Vgg module 114. During operation of the IC, the stored region-specific value is used to adjust the amount of trim performed by the corresponding trim circuit 124 via control signal 128.

One skilled in the art will recognize that testing can be performed using a number of different methods at different times. For example, testing may be performed during wafer sorting. In one example implementation of wafer-sort testing, each regulated Vgg output voltage 132 may be input to a Vgg testing circuit. The voltages to be measured may be transmitted to a system monitor, a probe pad, and a package pin in order to provide convenient monitoring. During wafer-sort testing, the regulated Vgg output voltage 132 of each module on each individual die is measured and trimmed to determine the region-specific trim value. The region-specific trim value for each individual Vgg module may be programmed into the persistent memory during this phase of wafer-sort testing.

In one or more other embodiments, the Vgg test circuit 108 may include built-in self-test circuitry to determine region-specific trim values the first time the IC is powered on. Alternatively, the region-specific trim values may be determined in response to an external user command. The Vgg test circuit 108 is configured to store the determined values in the persistent memory 106 as described above.

Figure 2:
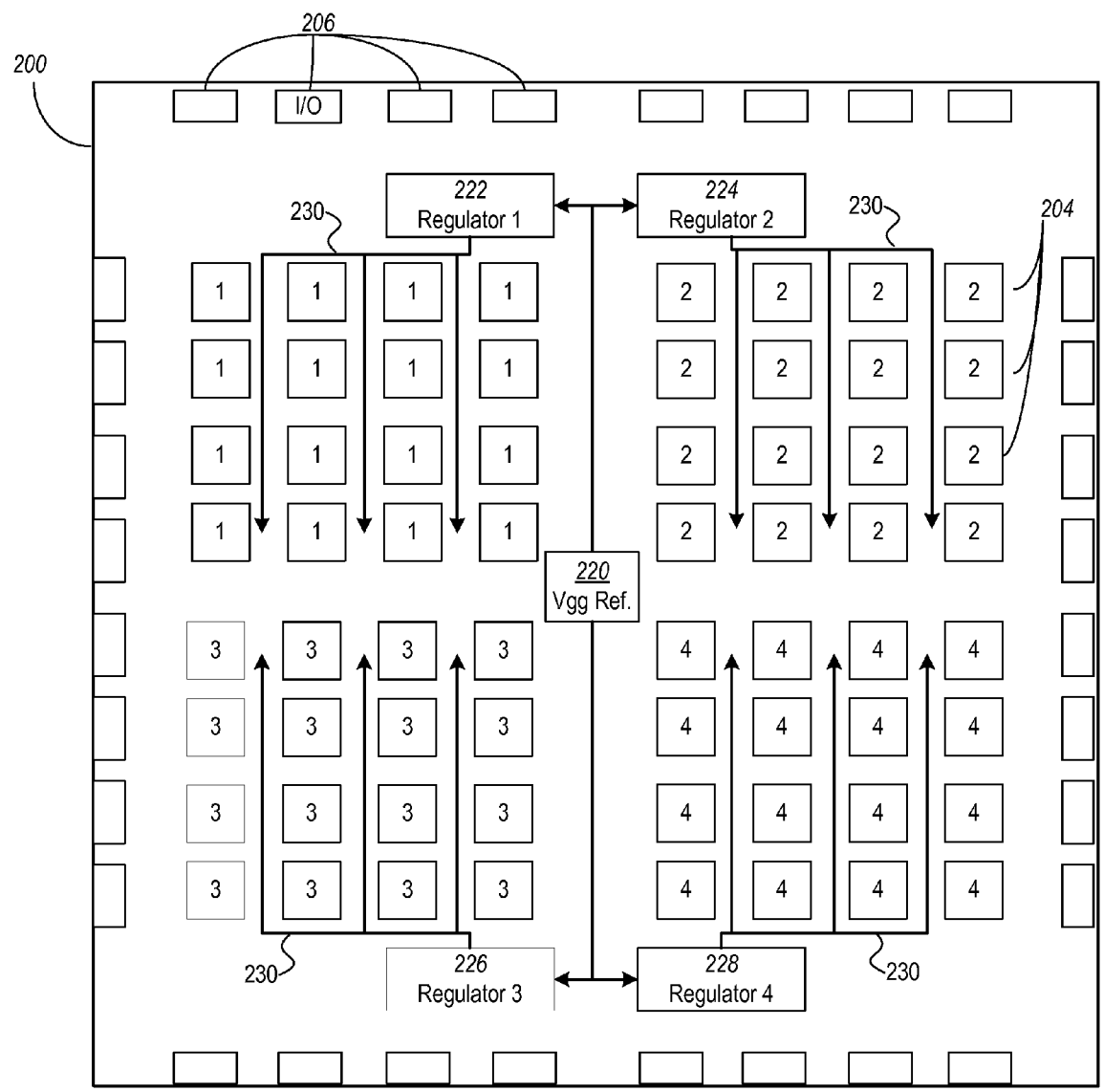
FIG. 2 illustrates a programmable IC having uniform power regulation performed access four regions of programmable logic.

FIG. 2 shows an example programmable IC 200 configured for uniform power distribution. The programmable IC includes configurable logic blocks (CLBs) 204, along with input/output blocks (IO) 206 to communicate with other devices. A Vgg reference circuit (Vgg_Ref) 220 is configured to generate a reference voltage. In this example, the CLBs 204 are partitioned into four regions for power regulation. Each region includes a respective one of regulator circuits 222, 224, 226, and 228. The reference voltage generated by Vgg_Ref circuit 220 is distributed to the regulator circuits. Within each region the corresponding regulator circuit is configured to produce a respective gating voltage 230 to drive the Vgg driver circuits (not shown) in the region. The regulator circuits are configured to adjust the respective gating voltages 230 according to the Vgg reference voltage and the regulated Vgg output voltage that is trimmed by a region-specific trim value as discussed above.

Figure 3:
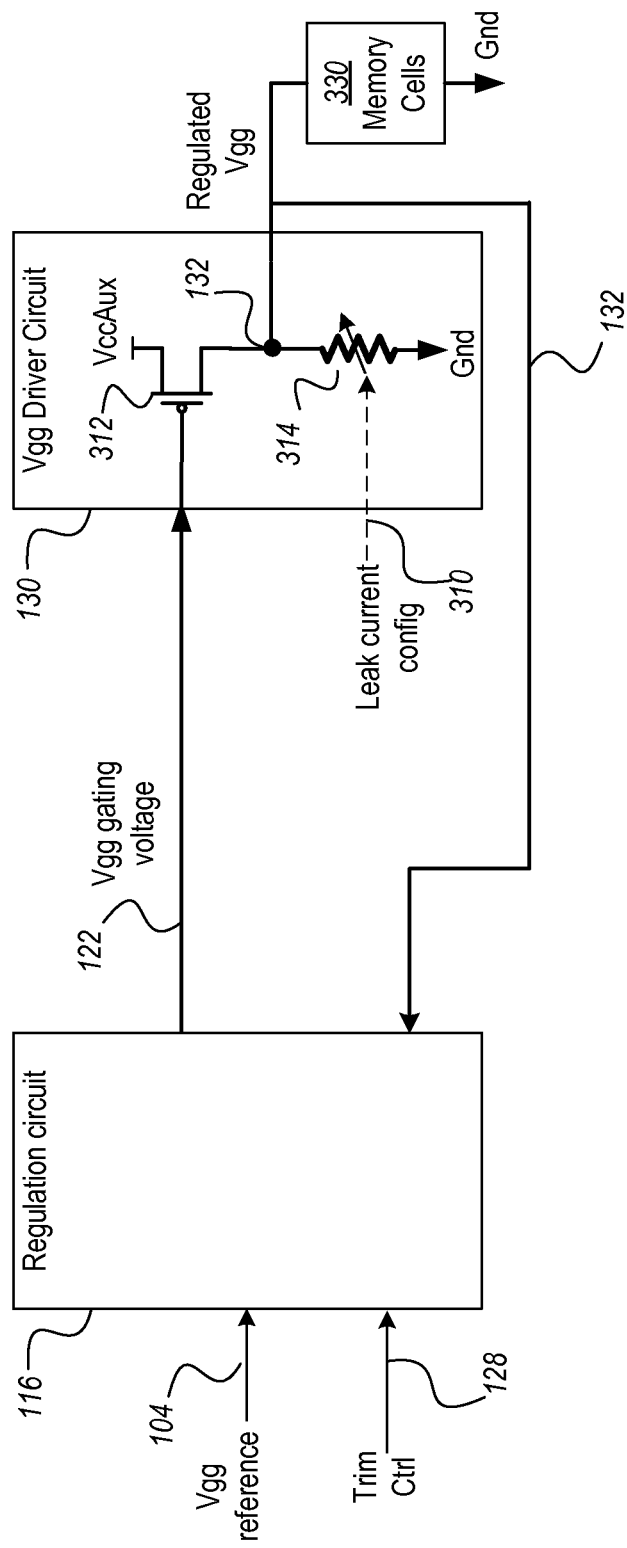
FIG. 3 shows an example circuit for power regulation of one region.

FIG. 3 shows an example implementation of the VGG module shown in FIG. 1. In this example, the regulated Vgg output voltage 132 is used to power a load 330 that includes a plurality of memory cells. The example driver circuit 130 includes a pull-up transistor 312 coupled to selectably pass current from a source voltage, VccAux as the regulated output voltage 132 in response to the Vgg gating voltage 122 from the regulation circuit 116.

One skilled in the art will recognize that the current drawn by a load coupled to the regulated Vgg output voltage generally is not constant. In this implementation, the driver circuit 130 includes a leaker circuit 314, which draws a constant current to ensure that the pull-up transistor 312 remains in saturation. In effect, the leaker circuit sets a minimum current draw of the load placed on the pull-up transistor. This additional leakage current makes the current requirements more predictable across temperature and process variations by increasing the current load placed on the pull-up transistor 312. Because the current requirements are more predictable, transistor sizes used in the regulation circuit 116 and driver circuits 130 can be better selected to provide a consistent phase margin across temperature and process variations.

The minimum current draw necessary may depend on the connected load 330. For example, if the load includes memory cells the current drawn by the memory cells may depend on the number of memory cells driven by the driver circuit. If a larger number of memory cells is included in the load, they will draw more current. This distinction may be noteworthy because a family of programmable integrated circuits may include different numbers of memory cells in the various devices of the family. In one or more embodiments, the leaker circuit 314 can be configured to leak a smaller amount of current. In this example, the current draw of leaker circuit 314 is controlled by leaker current configuration signal 310. In one implementation, this signal may be controlled by a device specific value stored in a persistent memory of the IC, such as eFuses. This value may be programmed during wafer sort and packaging of the IC.

Figure 4:
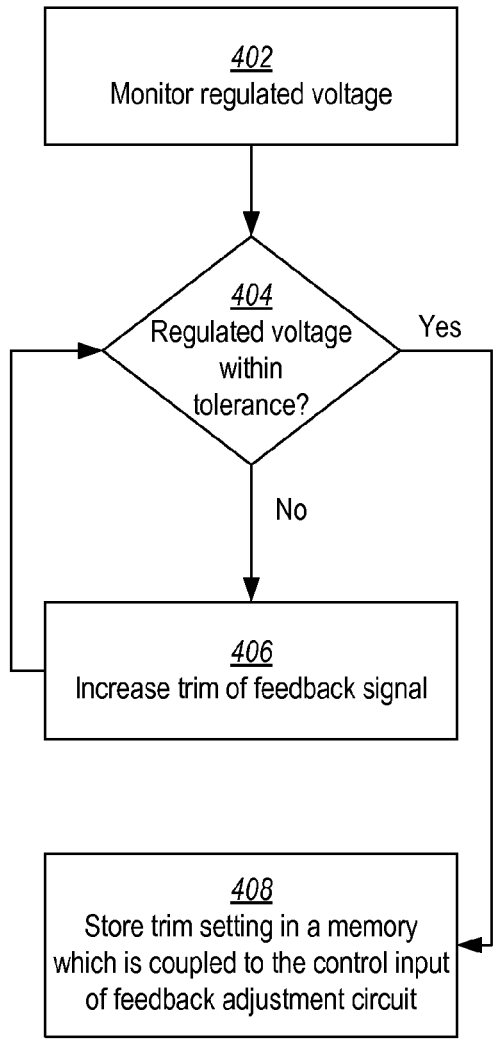
FIG. 4 shows a flowchart of an example process for testing and configuration of power regulation circuits with trim values specific of the respective region.

FIG. 4 shows a flowchart of a process for testing and configuration of a Vgg module. A regulated Vgg voltage produced by the Vgg module is monitored at block 402. If the regulated Vgg voltage is not within tolerance, decision block 404 directs the process to increase the trim of the feedback signal at block 406. Once the regulated Vgg voltage falls within tolerance, decision block 404 directs the process to store the current trim setting in a persistent memory of the IC at block 408.

Figure 5:
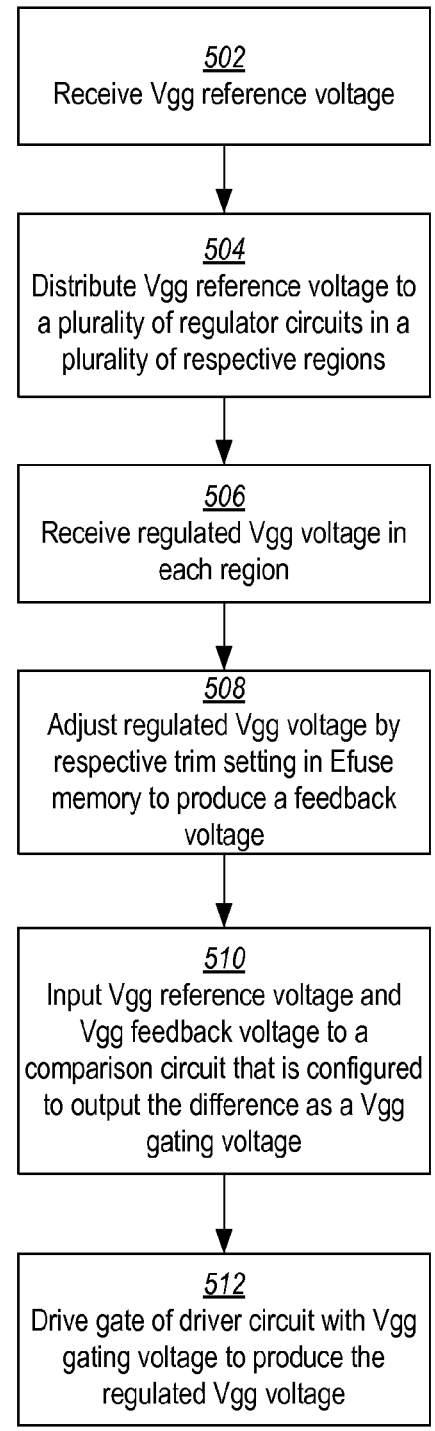
FIG. 5 shows a flowchart of an example process for region-specific power regulation.

FIG. 5 shows a flowchart of an example process for operation of a configured Vgg module. The Vgg reference voltage is received or generated at block 502. The Vgg reference voltage is distributed to a plurality of Vgg regulation circuits in respective regions of the IC at block 504. In each region, a regulation circuit is configured to receive a regulated Vgg voltage at block 506. At block 508, the regulated Vgg voltage is adjusted by the respective trim value, which was stored in persistent memory at block 408 of FIG. 4. The result of the adjustment is a Vgg feedback voltage.

The Vgg feedback voltage and Vgg reference voltage are input to a comparison circuit at block 510, and the comparison circuit outputs the difference to produce a Vgg gating voltage. One or more driver circuits in the respective region are controlled with the Vgg gating voltage at block 512 to produce the regulated Vgg voltage.

Figure 6:
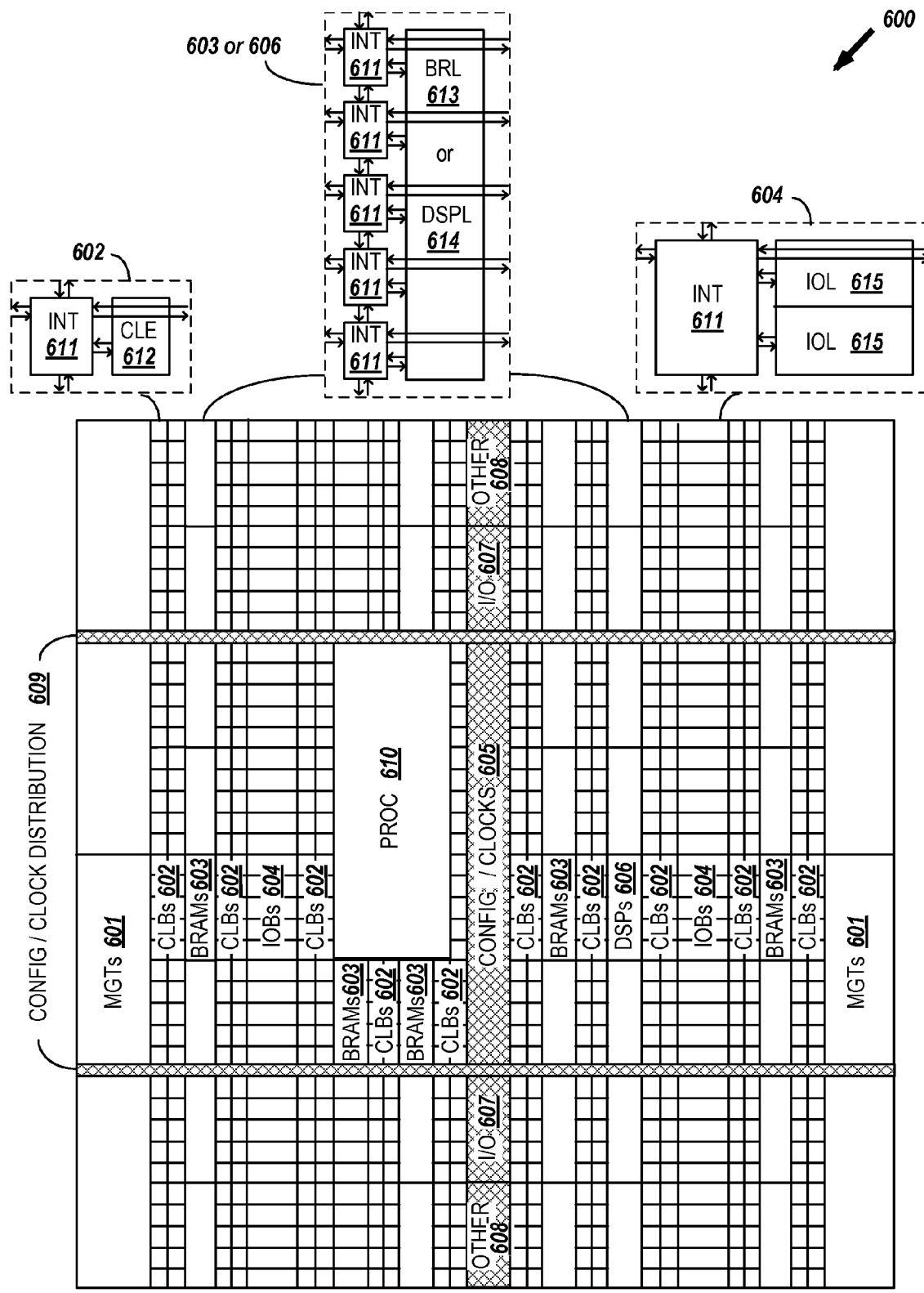
FIG. 6 illustrates a block diagram of a programmable integrated circuit for implementing a circuit design with a programmable operating voltage.

FIG. 6 is a block diagram of an example programmable integrated circuit that may be configured to regulate a voltage. Programmable ICs having programmable logic may include several different types of programmable logic blocks in an array. For example, FIG. 6 illustrates a field programmable gate array (FPGA) architecture 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSPs) blocks 606, specialized input/output blocks (I/O) 607, for example, e.g., clock ports, and other programmable logic 608 such as digital clock managers, analog-to-digital converters, system monitoring logic, and so forth. Some FPGAs also include dedicated processor blocks (PROC) 610 and internal and external reconfiguration ports (not shown).

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

One or more embodiments of the present invention are thought to be applicable to a variety of systems involving power regulation. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system for uniform power regulation of an integrated circuit, comprising:
    each region of a plurality of regions of the integrated circuit including:
        a comparison circuit having a first input coupled to receive a reference voltage and a second input coupled to receive a feedback voltage, the comparison circuit configured to provide a gating voltage;
        at least one driver circuit coupled to receive the gating voltage provided by the comparison circuit and coupled to a first supply voltage, the at least one driver circuit configured to provide a respective regulated voltage responsive to the gating voltage, wherein the at least one driver circuit includes:
            a pull-up transistor having a first source/drain coupled to the first supply voltage, a second source/drain coupled to the respective regulated voltage, and a gate coupled to the gating voltage; and
            a leakage transistor having a first source/drain coupled to the respective regulated voltage and a second source/drain coupled to a second supply voltage, the second supply voltage being equal to a ground voltage; and
        a feedback adjustment circuit having an input coupled to the respective regulated voltage of the at least one driver circuit and an output coupled to the second input of the comparison circuit, the feedback adjustment circuit configured to trim the respective regulated voltage by a region-specific trim value and output the trimmed regulated voltage as the feedback voltage on the output.

2. The system of claim 1, wherein the region-specific trim value causes the respective regulated voltage provided by the driver circuits of the plurality of regions to be equal.

3. The system of claim 1, wherein each region further includes a persistent memory coupled to the feedback adjustment circuit, the persistent memory configured with the region-specific trim value.

4. The system of claim 1, wherein:
    each of the plurality of regions further includes one or more additional driver circuits, each coupled to the first supply voltage and configured to provide a respective regulated voltage responsive to the gating voltage.

5. The system of claim 4, wherein, in each region, the regulated voltages of the at least one driver circuit and one or more additional driver circuits are coupled together to form a power distribution net of the region.

6. The system of claim 5, wherein the input of the feedback adjustment circuit of each region is coupled to the power distribution net of the region.

7. The system of claim 1, wherein the leakage transistor is programmable to pass a programmed amount of current.

8. The system of claim 7, wherein the leakage transistors of the driver circuits of the plurality of regions are programmed to pass equal amounts of current.

9. A programmable integrated circuit (IC) comprising:
    a plurality of programmable resources;
    a persistent memory; and
    a power regulation circuit coupled to the programmable resources and to the persistent memory, the power regulation circuit configured to perform operations including:
        providing a reference voltage to comparison circuits in each one of a plurality of regions of the IC; and
        in each of the plurality of regions:
            generating a respective gating voltage, the respective gating voltage being a differential signal between the reference voltage and a respective feedback voltage;
            enabling a respective first driver circuit responsive to the respective gating voltage, the respective first driver circuit coupling a power supply voltage to a respective regulated output voltage when enabled; and
            generating the respective feedback voltage by trimming the respective regulated output voltage by a region-specific trim value stored in the persistent memory; and
            leaking a respective fixed amount of current from the respective regulated output voltage to a ground voltage.

10. The programmable IC of claim 9, wherein each region-specific trim value stored in the persistent memory causes the respective regulated output voltage in each of the plurality of regions to equal the reference voltage.

11. The programmable IC of claim 9, wherein the persistent memory includes a respective persistent memory module in each of the plurality of regions, each respective persistent memory module coupled to a feedback adjustment circuit of the region and configured with the region-specific trim value.

12. The programmable IC of claim 9, wherein
    the power regulation circuit is further configured to, in each of the plurality of regions, enable a second driver circuit responsive to the respective gating voltage, the second driver circuit coupling the power supply to the respective regulated output voltage when enabled.

13. The programmable IC of claim 12, wherein, in each region, the respective regulated output voltages of the first and second driver circuits are coupled together to form a power distribution net of the region.

14. The programmable IC of claim 13, wherein, in each region, the respective feedback voltage is generated using a respective feedback adjustment circuit having an input coupled to the power distribution net of the region.

15. The programmable IC of claim 9, wherein the respective fixed amount of current is user configurable.

16. The programmable IC of claim 9, wherein the respective fixed amount of current is equal in all of the plurality of regions.

17. A power regulation circuit for an integrated circuit (IC), comprising:
    a reference voltage generator circuit; and
    at least two power regulation modules located in regions of the IC, each power regulation module including:
        a difference amplifier having a first input coupled to an output of the reference voltage generator circuit;
        a respective voltage driver having an input coupled to an output of the difference amplifier and having an output coupled to provide a respective regulated voltage to a power net of the region, the respective voltage driver including:
- a pull-up transistor having a first source/drain coupled to a first supply voltage, a second source/drain coupled to the respective regulated voltage, and a gate coupled to the input of the voltage driver; and
- a leakage transistor having a first source/drain coupled to the respective regulated voltage and a second source/drain coupled to a second supply voltage, the second supply voltage being equal to a ground voltage; and an adjustable voltage bridge having a first input coupled to the power net, a second input coupled to the ground voltage, and an output coupled to a second input of the difference amplifier.

18. The power regulation circuit of claim 17, wherein:
the adjustable voltage bridge of each power regulation module is coupled to a persistent memory and is configured to receive a voltage bridge setting from the persistent memory; and
each voltage bridge setting is a value configured to cause a voltage of the power net to equal a voltage output of the reference voltage generator circuit.

* * * * *